United States Patent [19]
Fullam et al.

[11] Patent Number: 6,023,779
[45] Date of Patent: *Feb. 8, 2000

[54] ELECTRONIC, ACOUSTICAL TONE GENERATING COMMUNICATIONS SYSTEM AND METHOD

[75] Inventors: Scott F. Fullam; Neil M. Peretz, both of Mountain View, Calif.

[73] Assignee: PocketScience, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/588,165

[22] Filed: Jan. 18, 1996

[51] Int. Cl.[7] .............................. H03M 13/00; H04L 1/18; H04M 1/00
[52] U.S. Cl. ................... 714/751; 379/88.13; 379/93.15; 379/93.37; 379/444
[58] Field of Search ................................ 371/32, 33, 34, 371/35; 455/556, 557; 379/444, 88.12, 88.13, 88.14, 88.15, 88.16, 93.01, 93.15, 93.37; 714/748, 749, 750, 751

[56] References Cited

U.S. PATENT DOCUMENTS

| | | | |
|---|---|---|---|
| Re. 32,365 | 3/1987 | Sebestyen | 340/311.1 |
| 3,593,279 | 7/1971 | Pumpe | 371/57.1 |
| 3,680,045 | 7/1972 | Meidan | 371/34 |
| 3,879,577 | 4/1975 | Progler | 178/23 A |
| 3,944,788 | 3/1976 | Comisar et al. | 235/54 F |
| 4,326,102 | 4/1982 | Culp et al. | 379/443 |
| 4,442,319 | 4/1984 | Treidl | 379/102.03 |
| 4,584,679 | 4/1986 | Livingston et al. | 714/749 |
| 4,691,314 | 9/1987 | Bergins et al. | 370/471 |
| 4,712,214 | 12/1987 | Meltzer et al. | 371/32 |
| 5,142,550 | 8/1992 | Tymes | 375/206 |
| 5,196,943 | 3/1993 | Hersee et al. | 358/403 |
| 5,257,307 | 10/1993 | Ise | 455/31.3 |
| 5,477,550 | 12/1995 | Crisler et al. | 371/32 |
| 5,509,050 | 4/1996 | Berland | 455/557 |
| 5,568,536 | 10/1996 | Tiller et al. | 455/557 |
| 5,588,009 | 12/1996 | Will | 714/749 |

OTHER PUBLICATIONS

Lin et al; Error Control Coding Fundamentals and Applications; Prentice–Hall, Inc.; pp. 12–13, Jan. 1983.

*Primary Examiner*—Emmanuel L. Moise
*Attorney, Agent, or Firm*—Gray Cary Ware & Freidenrich LLP

[57] ABSTRACT

A multi-function electronic messaging system for transmitting messages over a first communications link having a remote unit for generating forward error corrected signals representing various types of electronic messages, for generating acoustical tones corresponding to the error corrected signals is provided. The acoustical tones are coupled to the send-only first communications link and transferred to a computer. The computer sends an acknowledgement signal back to the user of the remote unit over the first communications link and decodes and error checks the signals. The computer also reformats the various messages and resends them out over various communication links depending on the ultimate destination of the message. The computer may also send messages to the remote unit over a receive-only second communications link. A multi-level method of error detecting and correcting data is also disclosed.

21 Claims, 12 Drawing Sheets

ELECTRONIC, ACOUSTICAL TONE GENERATING COMMUNICATIONS SYSTEM AND METHOD

BACKGROUND OF THE INVENTION

The present invention relates generally to an electronic messaging system, and more particularly to an inexpensive, portable electronic messaging system and method that allows transmission of facsimile, electronic mail and pager messages over a first communications link, as well as reception of incoming messages over a second communications link.

Prior to the proliferation of computers, people communicated store-and-forward style messages (i.e., messages that are first stored in some manner and then later forwarded) using facsimile machines and direct computer-to-computer data connections over existing and leased telephone lines. As computers became cheaper and easier to use, people began using more advanced facsimile machines, computer facsimile modems, and direct computer-to-computer modem connections to transfer information between each other.

More recently, people began to use commercial on-line services to communicate large amounts of store-and-forward style information (i.e., electronic mail) with each other. Now, a new medium for communicating, the Internet, is attaining general public popularity. In the last five years, the number of people connected to the Internet has increased because the Internet allows users who have an Internet account, a modem, and a computer to communicate great amounts of information with each other, regardless of each party's method of accessing the Internet or the geographic location of their Internet access point, at minimal expense. For example, for the cost of a local telephone call, a person in California can send a long electronic mail (e-mail) message to a friend (who also must have Internet access) anywhere in the world. Due in large part to the Internet, the popularity of electronic store-and-forward messaging, such as e-mail, has also increased exponentially.

Initially, due to the large size of computers, people typically only accessed the Internet from a desktop computer. Later, as the size of computers decreased from desktops to notebooks to palmtops, people could carry their computer with them wherever they go and access their e-mail account from any location where they could locate a telephone jack to connect, via modem, to the Internet.

At the same time that e-mail was increasing in popularity, paging technology was also increasing in popularity. Many people carry pagers to ensure that others can easily reach them at any time. In addition, a new product category of portable computer, known as a personal digital assistant (PDA) was introduced. The PDAs are basically very small handheld computers (several of which offer limited messaging capabilities, such as paging or e-mail), but are priced too high (i.e., in excess of $500) for purchase by the average consumer and do not offer communication features well-tailored to the average consumer user's needs.

Today, a number of PDAs are on the market. One well-known PDA has a small touch-sensitive screen controlled by special user-interface software. This PDA also has a modem that allows a user to communicate with a computer network and to send e-mail messages, facsimiles, and pager messages. This PDA and its accessories, however, are very expensive, and require that the user locate a phone jack for message transmission and reception. In these well known current PDA systems on the market today, all messages are transmitted and received over the same communications link, which requires an expensive modem and extensive handshaking time between the modem in the PDA and the modem to which the PDA is connected.

A second well known PDA is a cellular telephone with a touch-sensitive backlit display that acts as a keyboard. This second PDA has the ability to send facsimiles, to communicate with commercial on-line services, and to manage a user's schedule with a built-in time management system. This second PDA, however, is also very expensive and too large and heavy to carry around in a user's pocket. In addition, due to this PDA's circuit-switched communications, costs can be very high because it can only communicate over more expensive cellular telephone systems, rather than using less expensive landline telephones and short-burst packet data transmission protocol. In addition, because this PDA relies solely on cellular communications, it has relatively high power consumption, which leads to a very short battery life.

All of the known messaging systems that allow a user to both send and receive multiple types of electronic messages (i.e., facsimile, pager and e-mail) are too large, too expensive, too inconvenient (i.e., they require telephone connectivity through an RJ-11 telephone jack) or drain a battery too quickly. In addition, these known systems cannot send a message reliably over a normal public pay telephone line or many cellular links due to occasional line noise problems that cannot be corrected by known systems, and due to a lack of more convenient (i.e. appropriate acoustic) telephony coupling technology. In addition, none of these known systems provide an inexpensive way to send different types of messages and also provide the user with an audible acknowledgement signal from the receiving computer indicating whether or not the message is sent correctly.

Thus, there is a need for an electronic messaging system that is inexpensive and transmits various types of electronic messages over any type of communications link. There is also a need for an electronic messaging system that has a system for sending an audible acknowledgement signal back to the user and a system for performing multiple levels of error detection and correction. The electronic messaging system in accordance with the invention addresses the above problems of conventional messaging systems and it is to this end that the invention is directed.

SUMMARY OF THE INVENTION

The invention provides an inexpensive, portable electronic messaging system and method that may be easily coupled to a communications link, such as a pay telephone handset It may send any type of electronic messages over a first communications link. The electronic messaging system also receives incoming messages over a second communications link that is separate from the first communications link.

The electronic messaging system may also send electronic mail, facsimiles, and paging messages over the same first communications link, through a computer; and allow a user to receive immediate audible feedback, (i.e., a signal acknowledging the receipt of the transmitted data) over the first communications link from the computer.

The electronic messaging system of the invention also may have a forward error correction scheme that increases the reliability of message transmission over a noisy communications link. The error correction scheme may include multiple levels of error detection and correction to further increase the message transmission reliability. The error correction levels may include data packet level error correction, resending corrupt data packets in response to a corrupt data packet acknowledgement signal from a central computer, and bit level error correction.

The electronic messaging system and method of the invention may employ a computer and a unit remote to the computer for communicating data between the computer and the remote unit. The remote unit may have a system for receiving input from a user and for producing electrical signals corresponding to the input data. The remote unit may also have a system for producing error corrected data based on the electrical signals and for producing acoustical tones corresponding to the error corrected data. The remote unit may also have a system for coupling the acoustical tones to a first communications link for transmission to the computer.

The computer may have a system for detecting and correcting errors in the data represented by the acoustical tones and a system for sending a signal back to the user of the remote unit over the first communications link to acknowledge receipt of the acoustical tones. The remote unit, in addition, may have a system for receiving data from the computer over a second communications link.

The electronic messaging system also may have a method of error detecting and correcting data in the computer that includes checking data packets for errors, resending any data in which any data packets contain any errors, comparing the data packets to the resent data packets, and comparing each bit in the data packets to each bit in the resent data packets to determine a correct bit. The method may generate an integrity flag, for each data packet, that indicates errors within each data packet.

DETAILED DESCRIPTION OF THE PREFERRED EMBODIMENTS

The present invention is generally applicable to an electronic messaging system that can transmit electronic messages, such as facsimile messages, pager messages, and e-mail messages. The electronic messaging system in accordance with the invention will be described in that context. It will be appreciated, however, that the system and method of the invention has greater utility.

The multi-function electronic messaging system in accordance with the invention may include a computer, and a hand-held, portable, battery powered unit. The unit is located remotely from the computer and generates and transmits electronic messages, such as pager, facsimile, and e-mail messages, over a first communications link to the computer, and receives incoming messages from the computer over a second communications link. The remote unit may also have a display device and an input device for creating and viewing messages. The remote unit may also have a coupling system so that signals from the remote unit may be coupled to and transmitted through the first communications link. The computer of the electronic messaging system may receive the incoming remote unit electronic messages, may detect and correct errors in remote unit signals, and may transmit an audible signal back to the user of the remote unit, over the first communications link, indicating receipt of the remote unit signals. The computer may also transmit the various types of electronic messages from the remote unit (i.e., e-mail, pager, and facsimile) over various appropriate outputs, and transmits messages back to the remote unit over a second communications link.

Figure 1:
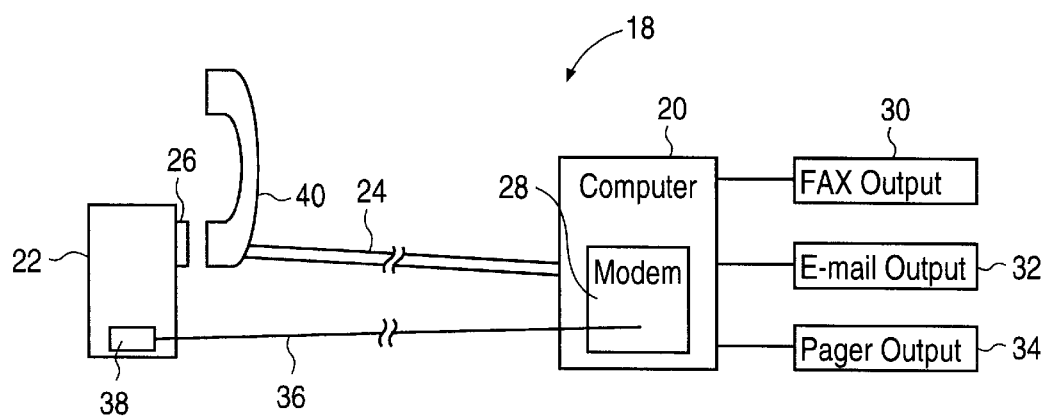
FIG. 1 is a schematic diagram of an embodiment of the electronic messaging system of the present invention including a computer and a unit remote to the computer for communicating electronic messages between the computer and the remote unit.

FIG. 1 is a schematic diagram of an electronic multi-function messaging system 18 embodying the invention. As shown, the electronic messaging system 18 may include a computer 20, and a portable unit 22 remote to the computer. A first communications link 24, such as an ordinary telephone line, may connect the remote unit 22 to the computer 20 to permit the transmission of messages from the remote unit to the computer. The remote unit preferably generates acoustic tone patterns (V.23 CCITT originating station modem tone frequencies to indicate a serial 1/0 bit stream) representing various types of electronic messages created by a user. The acoustic tones may be output by an output device 26, such as a speaker, and transmitted over the first communications link to the computer, which interprets the tones from the remote unit using a data receiver modem 28, that is described below in more detail. The computer may detect and correct errors in the data, as described below, sent to it by the remote unit, and may generate an audible signal that is sent back to the user of the remote unit over the first communications link. The signal may indicate a sufficiently error-free data transmission or may indicate that the data must be resent because the transmission is not sufficiently error-free.

The computer may also separate out the individual types of messages according to their ultimate destination (i.e., facsimile, e-mail, and pager messages), and send those messages to the appropriate sub-system within the computer that transmits the messages (i.e., a facsimile machine subsystem for transmission of facsimile messages). In the system shown in FIG. 1, the computer may have a facsimile output 30, an e-mail output 32 and a pager output 34. The multi-function electronic messaging system according to the present invention may process any other type of electronic messages and may also have additional types of functions, such as a voice messaging system. The computer may also send incoming electronic messages to the remote unit over a second communications link 36, as will be described below.

The separation of the first communication link for transmitting data from the second communications link for receiving data provides many advantages. In particular, the first communications link is used solely for unidirectional transmission of messages from the remote unit (i.e., send-only, with no handshaking between the computer and the remote unit), in packet form, and the second communications link is used solely for unidirectional transmission of messages from the computer to the remote unit (i.e., receive-only, with no handshaking between the computer and the remote unit), in packet form as well. This unidirectional transmission of packetized messages is faster than traditional bi-directional transmission because the bi-directional transmission requires handshaking and greater synchronization between the remote unit and the computer. The unidirectional transmission also may maximize the use of the most convenient communications link for time-sensitive messages from the computer to the remote unit, and may use more affordable bandwidth for the transmission of messages from the remote unit to the computer.

In this embodiment, the second communications link may be a wireless pager frequency link. To receive the incoming pager messages, the remote unit may have a pager receiver 38. In addition, the first communications link may be a pay telephone line with a receiver handset 40, and the remote unit speaker is held against the telephone handset microphone to couple the acoustical tones to the telephone line. The first and second communications links may be any type of communications link, and are not limited to the examples shown in FIG. 1.

Figure 2:
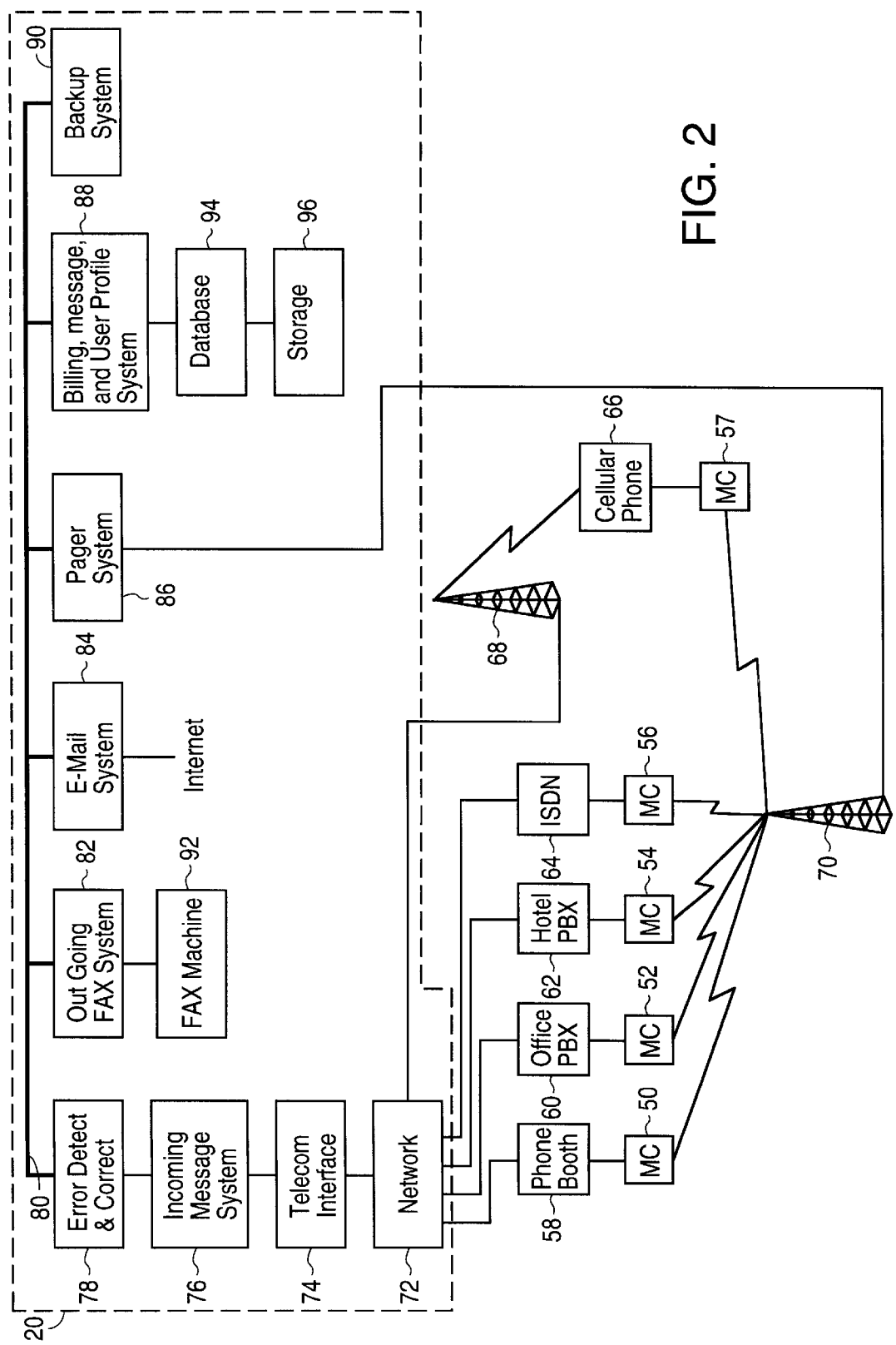
FIG. 2 is a block diagram of an electronic messaging system in accordance with the invention that has a plurality of remote units communicating with the computer.
Figure 3:
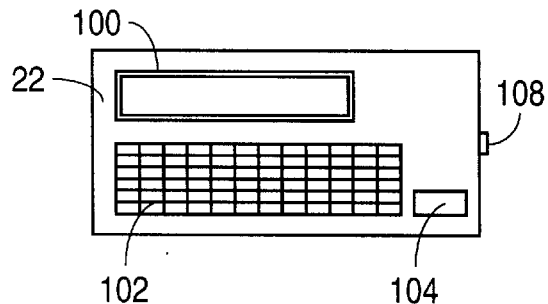
FIG. 3 is a front view of the remote unit shown in FIG. 1.

FIG. 2 is a block diagram of the computer 20 connected to a plurality of remote units 50, 52, 54, 56 and 57. The remote units may be connected to the computer, as shown, through a variety of different first communication links, such as a public telephone line 58, an office public broadcast exchange (PBX) 60, a hotel telephone switchboard and branch exchange 62, an ISDN link 64, or a cellular telephone link 66 through a cellular base station 68. In addition, as described above, the remote units may also have a built-in or external pager radio receiver (not shown), so that the remote units can receive incoming pager messages over the second communications link, such as radio pager system 70. All of the remote units attached to the different first communications links, are connected to the computer by a Public Switched Telephone Network (PSTN) 72 that may handle a plurality of telephone calls from remote units by switching the calls to various incoming telephone lines and a plurality of modems (not shown) in the computer. The modems are connected to a telecommunications interface 74 sub-system of the computer that interprets and translates (converts) the incoming acoustical tones from the remote units into electronic digital form. The telecommunications interface then forwards the interpreted incoming remote unit data to an incoming message System 76 that processes the incoming data from the remote units, and detection and correction of errors is performed in an error detection and correction system 78, and routes the messages to the appropriate outgoing systems, as described below. The operation of the incoming message system will be described below with reference to FIG. 9. All of the computer systems may include microprocessors or multi-tasking computer servers and are connected together by a backbone network 80, such as an Ethernet network, so that all of the systems within the computer may exchange data with each other. In this embodiment, the outgoing systems shown are an outgoing facsimile system 82, an e-mail system 84, a pager system 86, a billing, message and user profile system 88, and a backup system 90. The invention is not limited to the outgoing systems shown and may have other systems, such as a voicemail system.

If some of the data received by the incoming message system 76 is a facsimile message, then the message is first error detected and corrected in the error detection and correction unit 78 and then routed over the backbone network to the outgoing facsimile system 82, that may have a facsimile machine 92 or server attached to it for sending outgoing facsimile messages. If some of the data received by the incoming message system is an outgoing electronic mail (e-mail) message, the message is routed to the e-mail system 84, and then over an electronic mail channel, such as the Internet. For an incoming e-mail message to the remote unit user, the e-mail message is received by the e-mail system and routed to the pager system 86, which sends the message to the remote unit through a paging terminal and transmitter 70 in the form of a pager message. If some of the data received by the incoming message system is an outgoing pager message, then the message is routed to the pager system 86 that is connected to the paging terminal and transmitter 70.

The billing, message and user profile system 88 stores all of the information necessary to keep track of billing, message usage, and user profiles. The billing, message and user profile system may also have a database 94 and an archival storage device 96, for short term and long term storage, respectively, of the user profiles and billing information. The database also stores audible messages (i.e., prerecorded voice messages) that may be sent to the user of the remote unit user over the first communications link (i.e., as an acknowledgement that data from the remote unit has been properly received). The back-up system 90 may include a back-up facsimile system, a back-up e-mail system, a back-up pager system, a back-up incoming Message system and a back-up billing, message and user profile system that are all connected together by a back-up network. The details of the back-up system are not shown. This back-up system provides redundancy within the computer to reduce lost data due to crashes and other possible malfunctions and mishaps.

Figure 4:
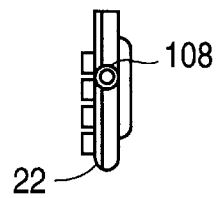
FIG. 4 is a side view of the remote unit shown in FIG. 1.
Figure 5:
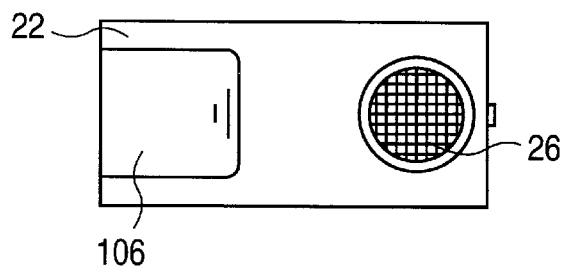
FIG. 5 is a back view of the remote unit shown in FIG. 1.
Figure 6:
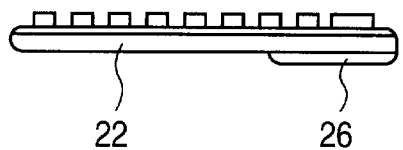
FIG. 6 is a top view of the remote unit shown in FIG. 1.

FIGS. 3, 4, 5 and 6 show a front, side, back and top views, respectively, of a preferred implementation of the remote unit 22. It may include a display device 100, such as a liquid crystal display (LCD), and a user input device 102, such as a keyboard. The input device receives information from the user, such as text messages, and later generates electrical signals corresponding to those electronic messages. The display device displays any electronic messages created by the user and displays any incoming messages. The display device also displays the address book, the calendar, and any other programs that are resident in the remote unit memory. To initiate the transfer of data from the remote unit to the computer, the remote unit may have a send button 104. On the back side of the remote unit, as shown in FIG. 5, there may be a battery compartment 106 and the sound output device 26, such as a speaker. The sound output device outputs modulated data tones (V.23 outgoing compatible tones) generated by a one-way acoustic data modulator (not shown) inside the remote unit. The sound output device permits the remote unit to communicate to the computer by coupling the acoustical tones to the first communications link, such as an ordinary telephone line as shown in FIG. 1. On the end of the remote unit, as shown in FIG. 4, is an interface port 108 so that a user can transfer data, such as e-mail addresses, calendar appointment records and saved e-mail messages, between the remote unit and a personal computer. As shown, the remote unit may be a small, handheld, pocket-sized, battery powered messaging system.

Figure 7:
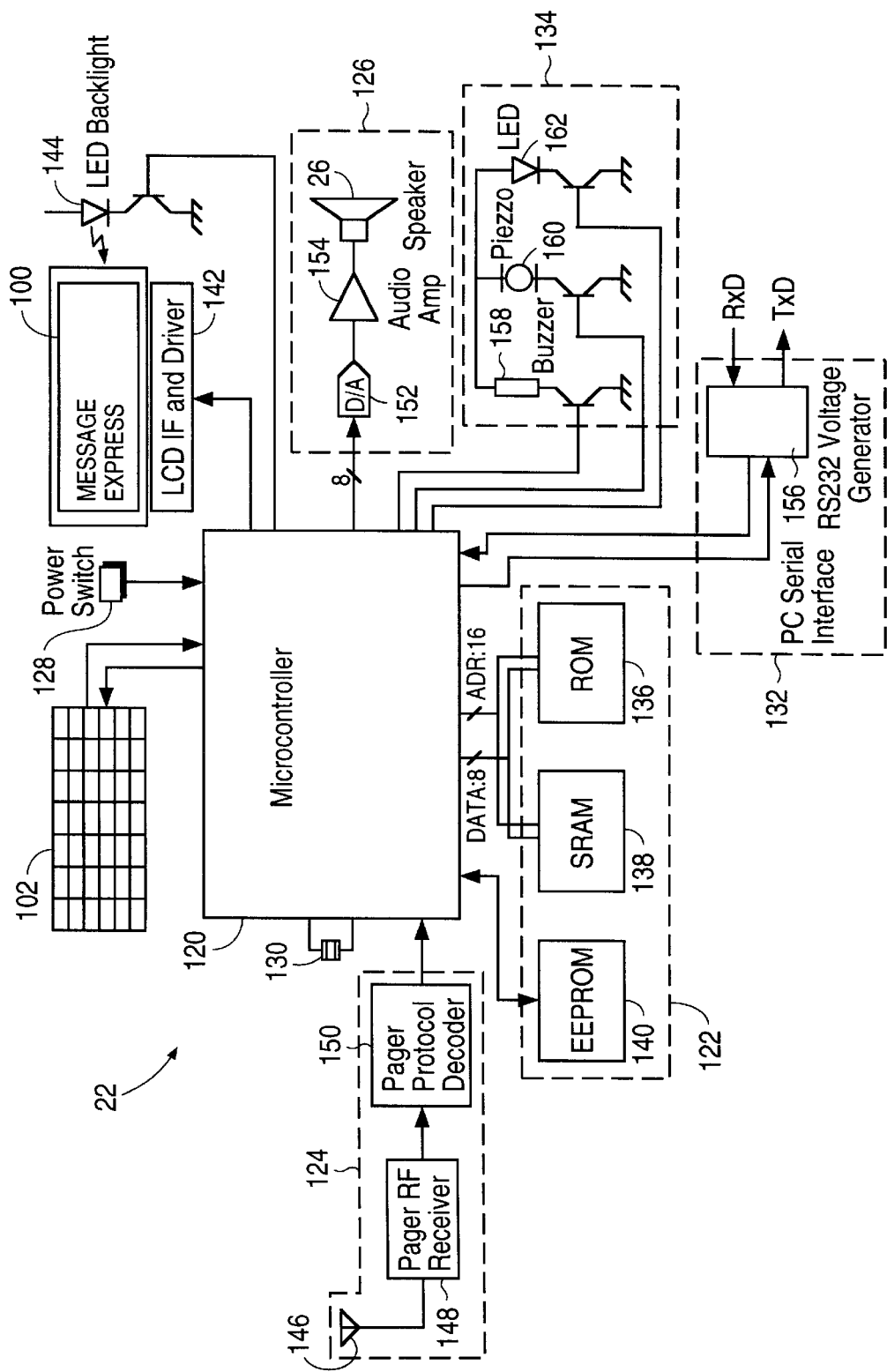
FIG. 7 is a more detailed block diagram of the remote unit shown in FIGS. 3–6.

FIG. 7 is a detailed block diagram of the remote unit 22, that may include the input device 102 that have a plurality of keys including the SEND key 104, as described above. The remote unit may also have a central processing unit (CPU) 120 that controls the operations of the remote unit, may generate forward error corrected data based on the electrical signals generated by the input device, and may generate acoustical tones for communicating the forward error corrected data to the computer. The CPU may also generate the acoustical tones from the electrical signals if no error correction is conducted on the electrical signals. The remote unit may also have an external memory unit 122 for storing data and software programs that run within the CPU, the display device 100 for displaying messages, an incoming message receiver 124, such as a pager system for receiving incoming messages from the computer, and a coupling system 126 for coupling the acoustical tones generated by the CPU to the first communications link (not shown). The memory unit may store an address book program, address book data, a calendar program, calendar appointment records, stored outgoing message data, an encryption system, an error correction system, and a plurality of incoming messages.

The CPU 120 may have a plurality of interfaces (not shown) that connect various input and output devices to the CPU, such as the input device 102, a power switch 128, a real-time clock 130, the display device 100, a PC interface system 132, the incoming message receiver 124, the external memory unit 122, and a user alert system 134. The external memory unit may include a ROM 136, an SRAM 138, and an EEPROM 140. The ROM may store various program code, including the software for generating the DTMF acoustical tones and the modulated data tones. The SRAM may store incoming and outgoing messages. The combination of a special battery switching circuit (not shown) and the SRAM means that the SRAM memory contents (incoming and outgoing message data) is not lost when the power is shut off to the remote unit. The EEPROM may store various data, such as a remote unit identification number, any e-mail screening criteria (described below), any encryption key, and any other configuration data.

The power switch 128 turns the remote unit on and off. The real-time clock 130 dates and time stamps all the outgoing messages, and provides a real time clock to the user. The display device 100 may also have an LCD driver 142 that controls the output device, and a light emitting diode (LED) 144 for backlighting the output device to allow viewing of the output device under low light conditions.

The outgoing and incoming messaging systems within the remote unit will now be described. The incoming messages may be received over the second communications link, such as pager frequencies, by the incoming message receiver 124 that may include a pager antennae 146, a pager receiver 148, and a pager protocol decoder 150. If a different type of second communications link is used, such as a wireless link, then another type of incoming message receiver may be used.

The outgoing messages of the remote unit may be coupled to the first communications link. For outgoing messages, a program stored in the ROM may generate electrical signal corresponding to messages input by a user with the input device. As described above, error corrected signals may also be generated by the CPU, depending on the type of error correction is selected by the user. Then, a software based tone generator, stored in the ROM, generates acoustical tones corresponding to the electrical signals or the error corrected electrical signals. Once the acoustical tones are produced, the tones are sent to the coupling system 126 where the tones are converted to a digital signal by a digital-to-analog converter 152, amplified by an audio amplifier 154, and output by the speaker 26. The acoustical tones, generated by the speaker, as described above, may be coupled to a first communications link 24 by, for example, holding the speaker near the pay telephone handset microphone 40, as shown in FIG. 1.

The remote unit may also have the PC interface system 132 that may include an RS232 interface 156 that sends data from the remote unit over an RS232 port (not shown) to a personal computer (not shown) and receives data from a personal computer over the RS232 port and converts that data into remote unit compatible data. The user alert system 134 may include a vibrating buzzer 158, a piezoelectric beeper 160, and an LED 162. All of these devices are used to notify the user of the remote unit of various conditions.

For example, the vibrator may vibrate to notify the user that an incoming message has been received. Similarly, the buzzer and the LED may also be used to notify the user.

The operation of the electronic messaging system for generation and transmission of messages from the remote unit to the computer will now be briefly described. Once a remote unit user has entered a message into the remote unit using the input device, such as a keyboard or touch sensitive screen, the user indicates how the message is going to be sent (i.e., by facsimile, e-mail or pager). The user may also enter multiple messages to be ultimately sent through a variety of transmission methods and mediums. The user may also view the messages that he is creating using the output device. Once all of the messages have been entered and stored, the CPU of the remote unit generates electrical signals corresponding to the electronic messages of the user and also, if the option is selected, the remote unit produces forward error corrected signals corresponding to the electrical signals. Then, the user can go to a first communications link, such as a pay phone or any other communications link, such as cellular telephone, and dial an access number that connects the user to the computer.

Once the user connects to the computer, the computer will request, via an audible message (i.e., a prerecorded voice message), that the user place the remote unit speaker against the telephone handset microphone, and initiate the message transfer from the remote unit to the computer. When the user depresses the SEND button, the CPU and software based tone generator generate acoustical tones corresponding to either the electrical signals or the forward error corrected electrical signals. The remote unit couples the acoustical tones to the first communications link using the speaker and the messages, in the form of electrical signals, are transferred to the computer. The messages that are sent by the remote unit to the computer may be encrypted for security or compressed to decrease the sending time. The messages may also be forward error corrected, as described above.

Once the message transfer is complete, the computer, using an error correction and detection method that will be described below, tests the message to determine if the message is sufficiently error-free. In the computer determines that the messages are sufficiently error-free, the computer then audibly notifies the user, using a synthesized or pre-recorded voice message or a tone, that the transfer of messages was successful. If the computer determines that the message contains too many errors, the computer will play a different audible message through the first communications link to tell the user to resend the message. The details of the messaging transfer protocol, and the error correction method will be described in more detail below.

Figure 8:
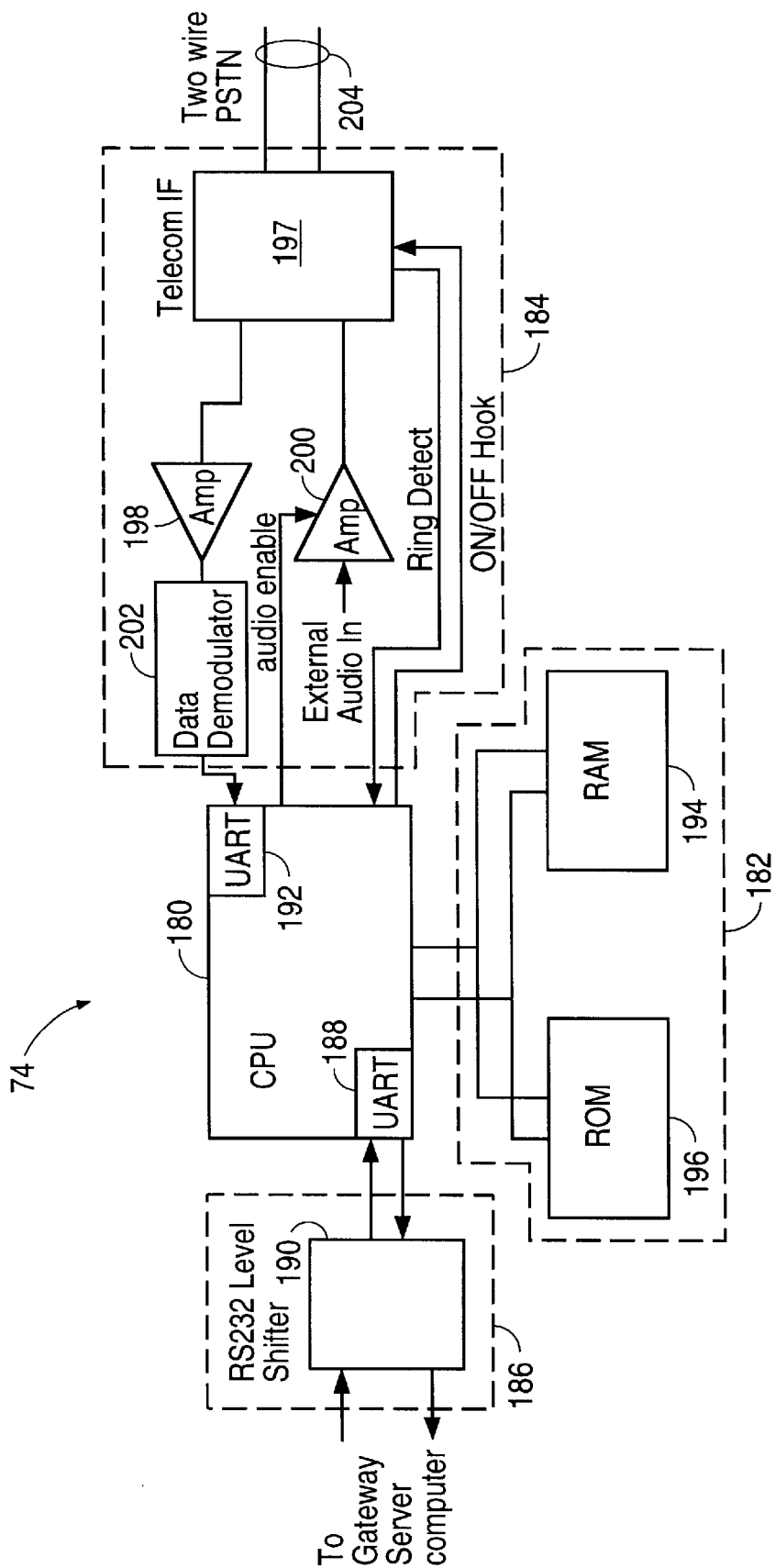
FIG. 8 is a more detailed block diagram of the telecommunications interface that sends incoming messages to the computer of FIG. 1.

FIG. 8 is a detailed block diagram of the telecommunications interface 74 that is part of the data receiver modem 28, shown in FIG. 1. The modem may include a modem CPU 180, a memory unit 182, a message transceiver 184, and an incoming message system interface 186. The modem CPU may have a first UART port 188 that communicates with the incoming message system interface, such as an RS232 level shifter 190 to communicate data back and forth between the incoming remote unit server and the data receiver modem. A second UART port 192 in the CPU connects to the message transceiver for receiving remote unit data (acoustical tones) and transmitting a signal acknowledging receipt of the remote unit data back to the user of the remote unit over the first communications link.

The memory unit 182 may have a RAM 194 that may act as a buffer for the incoming electronic messages and may temporarily store program information and variables, such as the set-up information for each particular remote unit. The memory unit may also have a ROM 196 for storing software programs that run on the modem CPU. The incoming data from the remote unit and outgoing acknowledgement signals to the user of the remote unit go through the message transceiver that may include a telecommunications interface 197, a first and second amplifier 198, 200, and a data demodulator 202. The incoming data from the remote unit may be carried over the first communications link (not shown) to another communications network, such as a Public Switched Telephone Network (PSTN) 204, or the first communications link itself may be the PSTN. The incoming tones are converted to electrical signals by the telecommunications interface, amplified by the first amplifier, demodulated by the data demodulator, and enter the modem CPU through the UART port. For outgoing acknowledgement signals sent out over the PSTN and any other first communications link, the modem CPU signals another sub-system (not shown) within the computer to generate a signal, such as a synthesized or pre-recorded audio message. The modem CPU also controls this signal by controlling the enabling signal to the second amplifier 200. Thus, the signal is fed into the second amplifier, through the telecommunications interface, and transmitted over the PSTN 204 or any other first communications link back to the user of the remote unit. The telecommunication interface 197 is controlled by an ON/OFF hook signal (the phone line is switched between on and off hook conditions) generated by the modem CPU. An incoming ring condition from the PSTN generates a ring detect signal that is fed into the modem CPU, causing the modem CPU to activate the telecommunications interface.

Figure 9A:
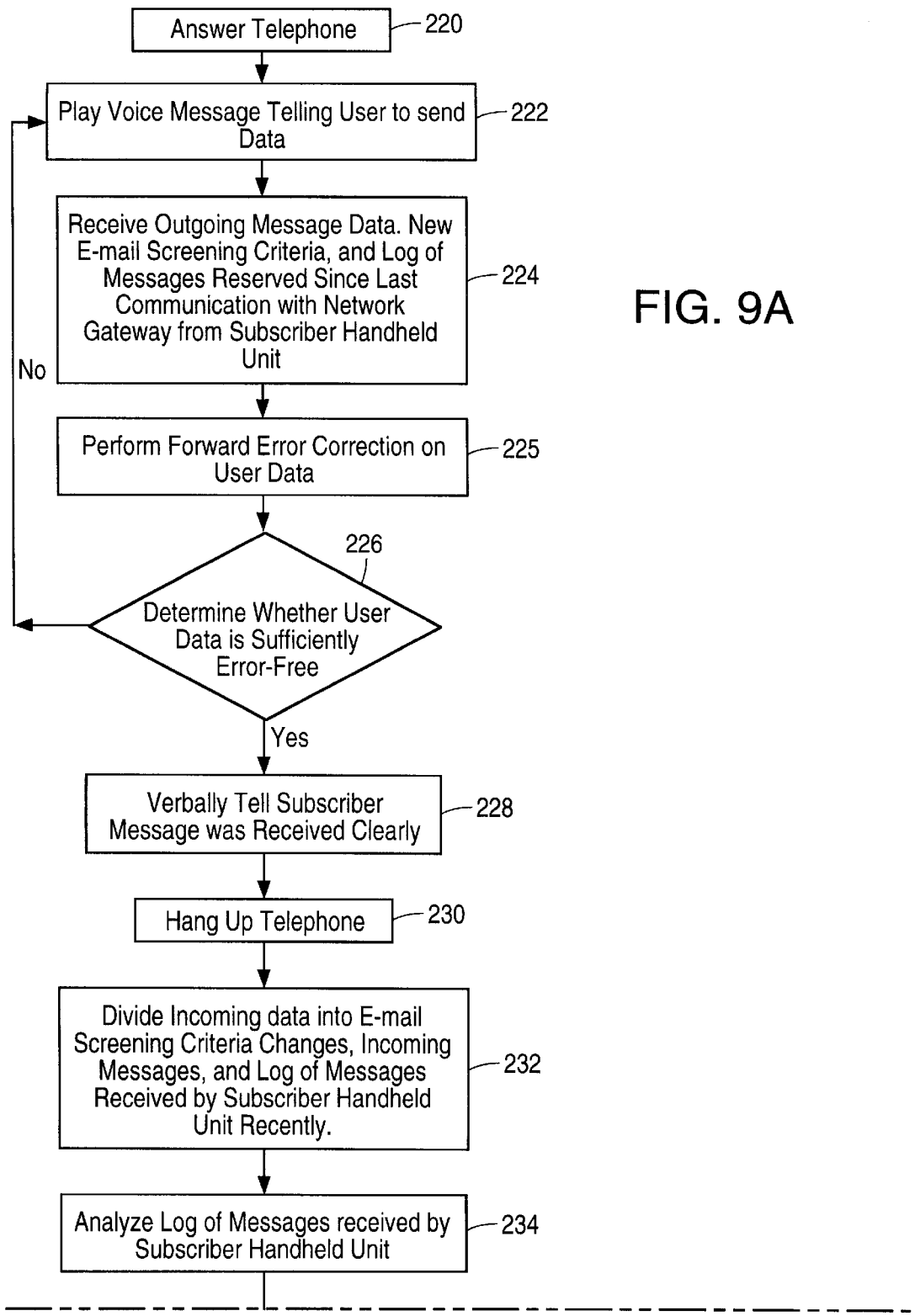
FIG. 9 is a flowchart showing a method of processing an incoming message from a remote unit that may be carried out by the incoming message system within the computer.
Figure 9B:
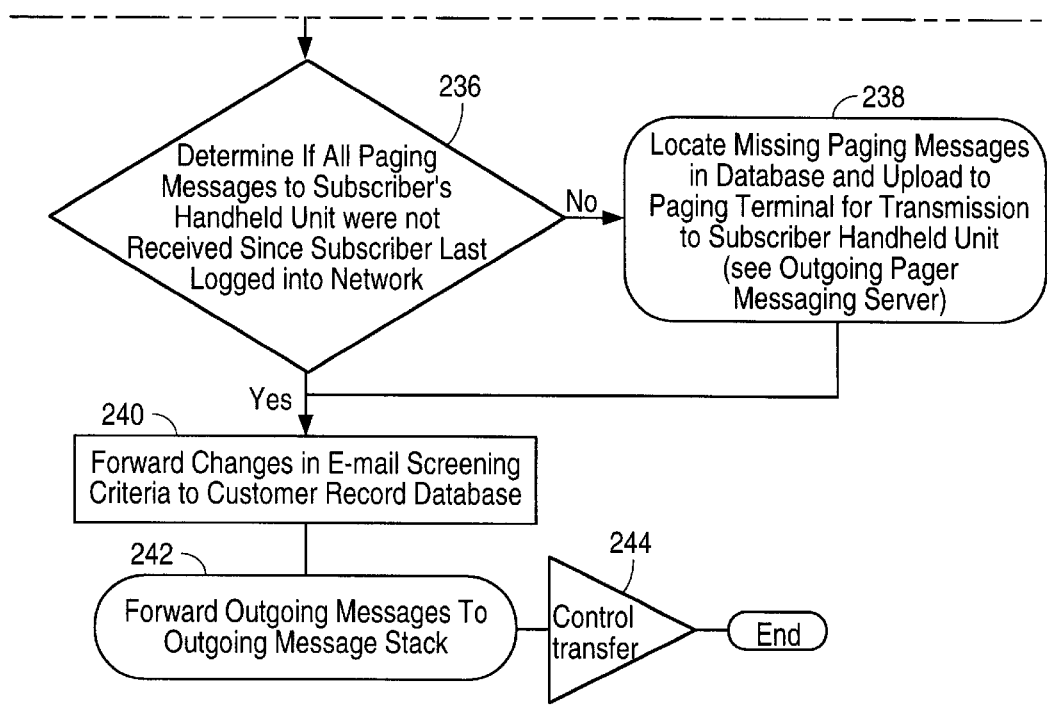
Figure 9:
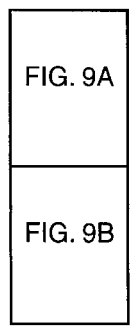

FIG. 9 is a flowchart showing the operation taken by the incoming message system 76, shown in FIG. 2, for processing an incoming remote unit message. At 220, the telephone call from the user with the remote unit is answered by the incoming message system and, at 222, the incoming message system plays an audible message, such as a synthesized or pre-recorded voice message, instructing the user to "Send the data now" by holding the remote unit next to the telephone handset microphone and pressing the Send button. The voice message played by the incoming message system may be stored in the database, shown in FIG. 2. Then at step 224, the incoming message system receives data from the remote unit, including any outgoing message data, any new e-mail screening criteria, and a log of pager messages received by the remote unit since last communication with the incoming message system.

The e-mail screening criteria allow the computer to automatically screen e-mail messages ultimately destined for the remote unit user. For example, messages that are sent from a person considered particularly annoying by the user of the remote unit may be screened out. The pager message log is used to ensure that the remote unit user receives all of his/her incoming pager messages and to cause the computer to retransmit any lost pager messages. After the error correction and detection is performed at 225, at 226, it is determined whether or not all of the data received from the remote unit is sufficiently error-free. The error detection and correction that occurs in the incoming message system when a message is received will be described in more detail below with reference to FIG. 11–14. If the data contains too many errors, then control goes back to 222, where the incoming message system plays an audible message requesting that the data be resent. However, if the data is sufficiently error-free, then at 228, the incoming message system plays another audible message that tells the user that the data was received clearly. The messages played by the incoming message system may be stored in the database, shown in FIG. 2. After the data received message is played, the incoming message system hangs up the phone at 230.

After hanging-up the phone with the user, the further processing of the incoming data stream begins (232). The incoming data is separated into the e-mail screening criteria, as described above, the incoming messages (each being separated according to its ultimate destination), and the log of previously received pager messages, as described above. Then, the log of previously sent pager messages is analyzed (234) and compared to the log of previously received pager messages, and it is determined if all paging messages sent to the user's remote unit were properly received since the user last uploaded data to the incoming message system (236). If the user's remote unit has not properly received all of the previously sent pager messages, then the incoming message system locates the user's missing/lost pager messages in the database (238), shown in FIG. 2, and uploads them to the paging system, shown in FIG. 2, for re-transmission to the remote unit.

Once any missed pager messages have been re-transmitted, or once all previously sent pager messages have been confirmed as received, then the incoming message system at 240, forwards any changes in the e-mail screening criteria to a user records database stored in the database, shown in FIG. 2. Then, at 242, any outgoing messages are forwarded to an outgoing message stack and control in the computer is now transferred, at 244, to the individual systems that handle the various types of outgoing messages. For example, if the outgoing messages contained an e-mail message and a facsimile message, then control would go to the facsimile system and to the e-mail system. The various message systems in the computer may also operate simultaneously and independently and process several different messages simultaneously.

Figure 10:
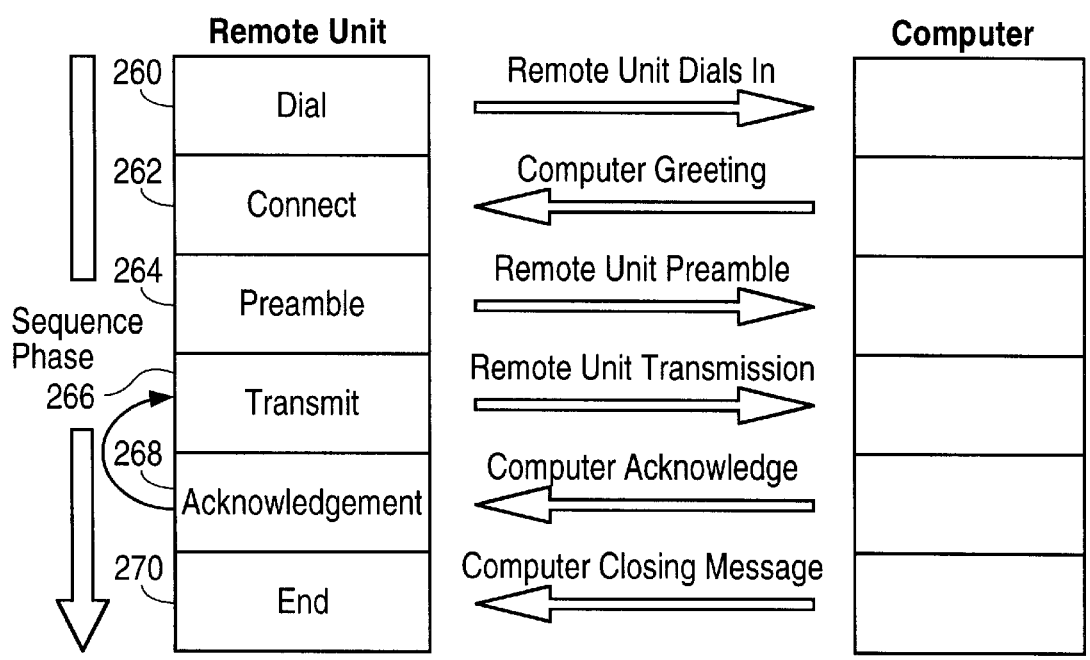
FIG. 10 is a schematic diagram showing the electronic messaging communications transfer protocol.

FIG. 10 is a schematic diagram showing the transfer communications protocol between the remote unit and the computer during data transfer. The transfer protocol provides a way of identifying the remote unit to the computer, a method of verifying that the data has been received correctly, and a way of requesting that the data be resent if it is received unclearly. As shown, there may be six phases of a data transfer between the remote unit and the computer, including a dial phase 260, a connect phase 262, a preamble transmission phase 264, a data transmission phase 266, an acknowledgement phase 268, and an end phase 270.

In the dial phase 260 and connect phase 262, a connection through a first communication link, such as a telephone line, is established between the user of the remote unit and the computer. The computer may generate an audio tone, or synthesized voice welcome message instructing the user to begin sending data. Once connected, the user holds the speaker of the remote unit close to the telephone handset microphone and presses the SEND button of the remote unit to initiate the preamble phase of the communications protocol between the remote unit and the computer.

In the preamble phase 264, the remote unit sends preamble data to the computer. The preamble data may include a synchronization part, a remote unit identification number, features data, a time and date stamp, error correction type data, modulation selection data, packet size selection data, a checksum, and extension data for any additional information. The features data notify the computer of the particular features of the particular remote unit in use at that time, such as the type of acknowledgement signal, whether a cellular phone connection is being used, whether the data is encrypted, and whether the acknowledgement from the computer to the remote unit user should occur at the end of each data packet transmission or at the end of all data packet transmissions (i.e., after the entire datastream containing the plurality of data packets has been transmitted). The preferred acknowledgement signal may be generated after the entire datastream has been transferred, as described above. The error correction data specifies the type of forward error correction being used for the data transmission. The packet size data permits the size of the data packets (i.e., the number of bytes between acknowledgement signals) to be varied between 1 byte and 256 bytes. The checksum data is transmitted in the preamble to enable the computer verify the integrity of the data in the preamble.

The remote unit may also permit the user to select one of several transfer modes before the data is transferred from the remote unit to the computer. The changes in the user selectable transfer mode may effect changes in the values of the data sent within the preamble, including the type of forward error correction being used, the type of modulation being used, and the number of times that data will be resent. The user selectable transfer mode may allow the user to choose between a cellular mode, a payphone mode (a payphone typically has more noise problems than a normal telephone line), and a normal telephone line mode. Each of these user selectable modes configures the transfer protocol differently to optimize the remote unit's transmission for each particular environment. For example, for a cellular connection, which is generally extremely noisy and hard to communicate over, the amount of forward error correction may be increased, the modulation may be changed, and the number of times data may be resent is increased. Thus, a user is able to select a transfer protocol that is optimized for a particular type of first communications link, and the remote unit may provide data formatted in that optimized transfer protocol to the computer.

Once the preamble is received and the computer has configured itself to receive data formatted in accordance with the user selectable transfer protocol, the remote unit transfers the data containing the various electronic messages and forward error corrected electronic messages in the transmit phase 266. Once the transmission of the data is complete, the computer checks all of the data packets within the data for errors, as described below.

In the acknowledgement phase 268, the computer transmits an acknowledgement signal that may either inform the user that the data was received without uncorrectable errors or inform the user that the data must be resent due to errors within the data packets. Once the data has been correctly received, the computer generates a closing message to the user, during the end phase 270, and closes the phone connection with the user and the remote unit.

The transfer protocol provides a system wherein the user of the remote unit may select a different transfer protocol, depending on the communications link to be used, in order to optimize the transfer, as described above. The transfer protocol may also permit the user to receive an audible acknowledgement signal from the computer. This acknowledgement signal enables the user to know that the data has been received without errors or must be resent immediately after the data transmission so the user can resend the data without having to reestablish another connection through the first communications link. A preferred error detection and correction scheme will be described below, but many different error detection and correction schemes, such as a checksum scheme, may be used in the encoding of data to be sent by the remote unit system.

Figure 11:
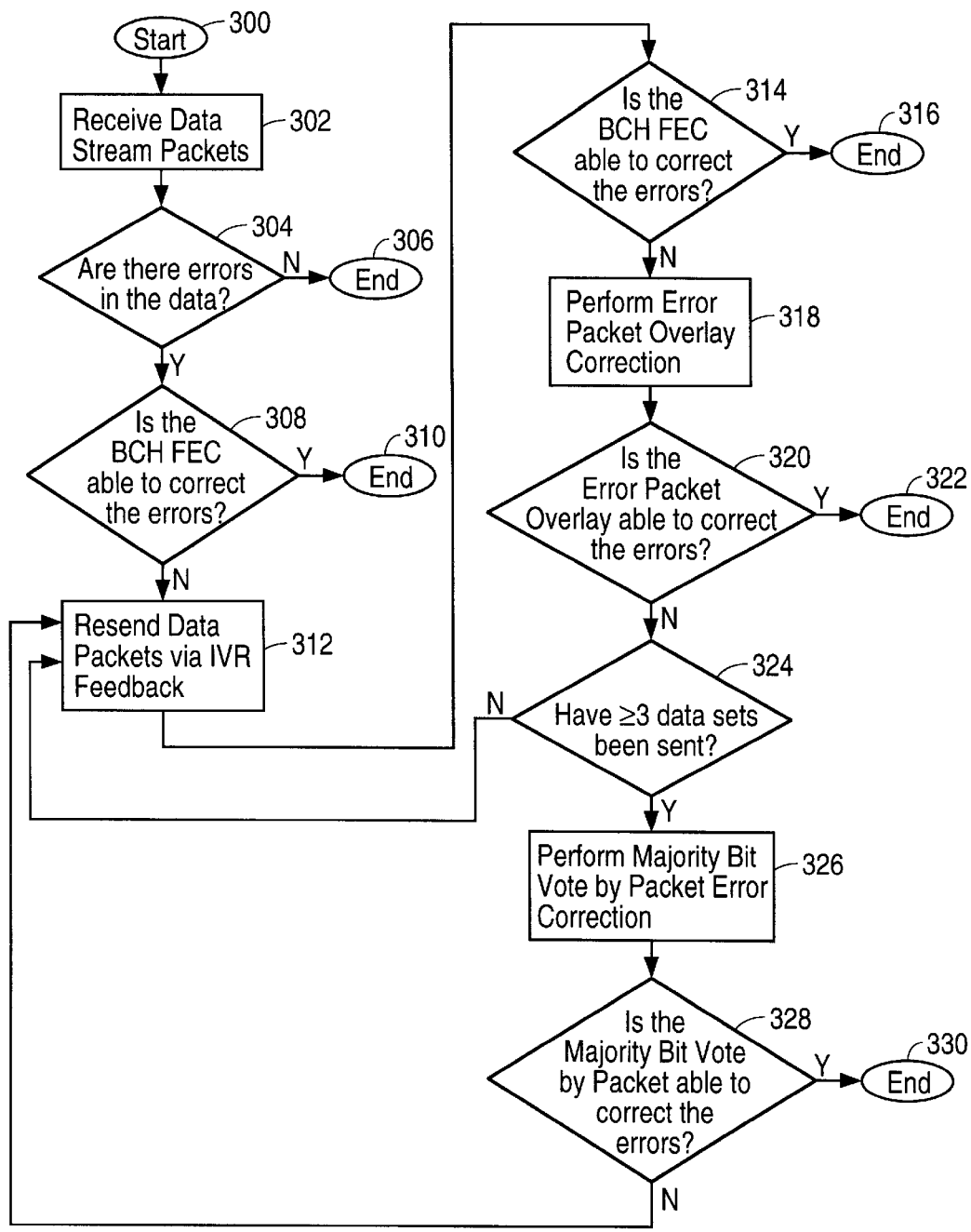
FIG. 11 is a flowchart of a method of multiple error detection and correction of the invention that may be carried out by the incoming message system.

FIG. 11 is a flowchart showing the error detection and correction method used in the electronic messaging system of the present invention. The error correction method of the present invention is carried out within the incoming message system 76 shown in FIG. 2. The encoding of the datastream (the data uploaded from the remote unit to the computer via the incoming message system and its modems) using the error correction method of the present invention takes place within the remote unit. At 300, the error correction method, that may include a Bose, Chaughuri, Hocquenghem (BCH) forward error correction system, message resending, and error packet overlay error correction begins. At 302, the incoming message system receives the error correction encoded datastream from the remote unit.

The datastream from the remote unit is first encoded by the CPU in the remote unit using a forward error correction method, such as a (15,7,2) BCH information code. With this BCH code, the original data from the remote unit is segmented into seven (7) bits, an extra parity bit is calculated (standard even/odd parity) and concatenated at the end of the fifteen encoded bits to generate a sixteen bit word that is easier for standard computer peripherals to use. The data is sent from the remote unit to the incoming message system sixteen (16) bits at a time. Thus, all data from the remote unit to the incoming message system is sent in sixteen (16) bit packets that include fifteen BCH code bits and one (1) parity bit. The fifteen BCH code bits contain seven (7) actual data bits and eight (8) BCH generated code bits. This BCH code can detect and correct up two (2) random errors within each sixteen bit data packet. In addition, the BCH error correction system can also detect more than two errors per packet, but cannot correct for them. In practice, up to four (4) sequential bit errors in a datastream can be corrected if those errors are equally split between two packets (i.e., if two errors occur at the end of packet N and two errors occur at the beginning of packet N+1).

At 304, the incoming message system determines if any BCH errors occurred within each packet. If there were no errors within any of the sixteen bit packets sent from the remote unit, then the error correction method is completed at 306. Similarly, if a packet had two or fewer BCH errors, then the BCH error correction method can correct for those errors at 308 and the method is completed at 310. If any data packet had more than two bit errors, the BCH error correction method detects the errors, and the incoming message system will request, through an audible tone or a voice message, that the remote unit user resend the data at 312.

After the data is resent at 312, the incoming message system determines if any errors are present within any data packet in step 314. If 0, 1, or 2 errors exist within a data packet of the resent datastream, then the error correction ends at 316. An error packet overlay correction, at 318, may be used, if errors still exist in any of the data packets. The error packet overlay error correction method will be described more fully below with reference to FIG. 12. At 320, it is determined whether any errors still remain after the error packet overlay correction. If all errors have been corrected by the error packet overlay correction, then the method ends at 322. If uncorrectable errors still exist within any data packet after the error packet overlay correction, then in step 324, it is determined whether the data has been sent more than three times. If the data has been sent less than three times, then the process returns to 312 where the data is sent again and error packet overlay correction is conducted. If the data has been sent three or more times, then at 326, a majority bit vote by packet correction method, described in more detail below with reference to FIG. 13, may be invoked. At 328, it is determined whether or not any errors remain after the majority bit vote by packet has been completed. If no errors are present, then the method ends at 330. If errors are still present after the majority bit vote by packet, then the process returns to 312 in which data is resent. In operation, the error correction method of the present invention provides three separate levels of error correction that ensure that an error-free datastream is received by the incoming message system.

Figure 12:
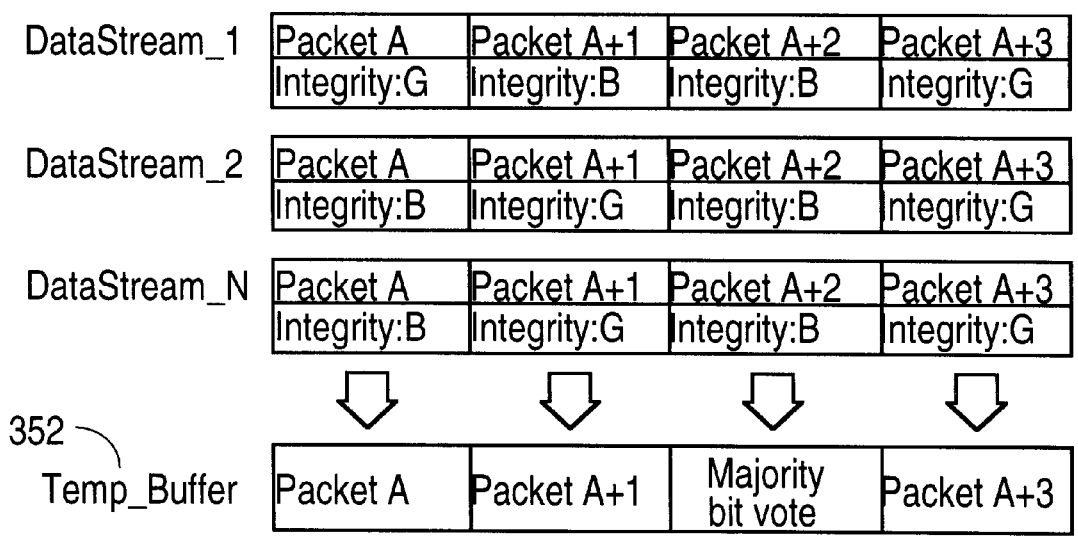
FIG. 12 is a schematic diagram of the error packet overlay error correction method that is part of error correction method shown in FIG. 11.

FIG. 12 is a schematic diagram showing the error packet overlay error correction method. As a datastream is received by the incoming message system, each 16 bit BCH packet has an integrity flag attached to it by the incoming message system that identifies the packet as a good packet (errors less than or equal to two) or as a bad packet (errors greater than two). If there is at least one bad packet in the datastream, then the entire datastream is resent. As provided above, the datastream may be resent up to N times yielding N datastreams (datastream_1, datastream_2, and so forth, up to datastream$_{13}$ N) that are stored temporarily. As shown, the integrity flags for each packet are also stored along with each individual data packet. A temp_buffer memory 352 is used to store the results of the error packet overlay error correction method set forth in FIG. 13. In the example shown in FIG. 12, for packet A, the packet from datastream_1 is stored in the temporary buffer because it has a good integrity flag. Similarly, for packet A+1, the packet from datastream_2 or datastream_N may be stored in the temporary buffer because both have good integrity flags. For packet A+2, since all of the datastreams have bad integrity flags, the majority bit vote by packet error correction method is conducted. Finally, for packet A+3, any once of the packets from the three datastreams may be used because all of the integrity flags are good.

Figure 13:
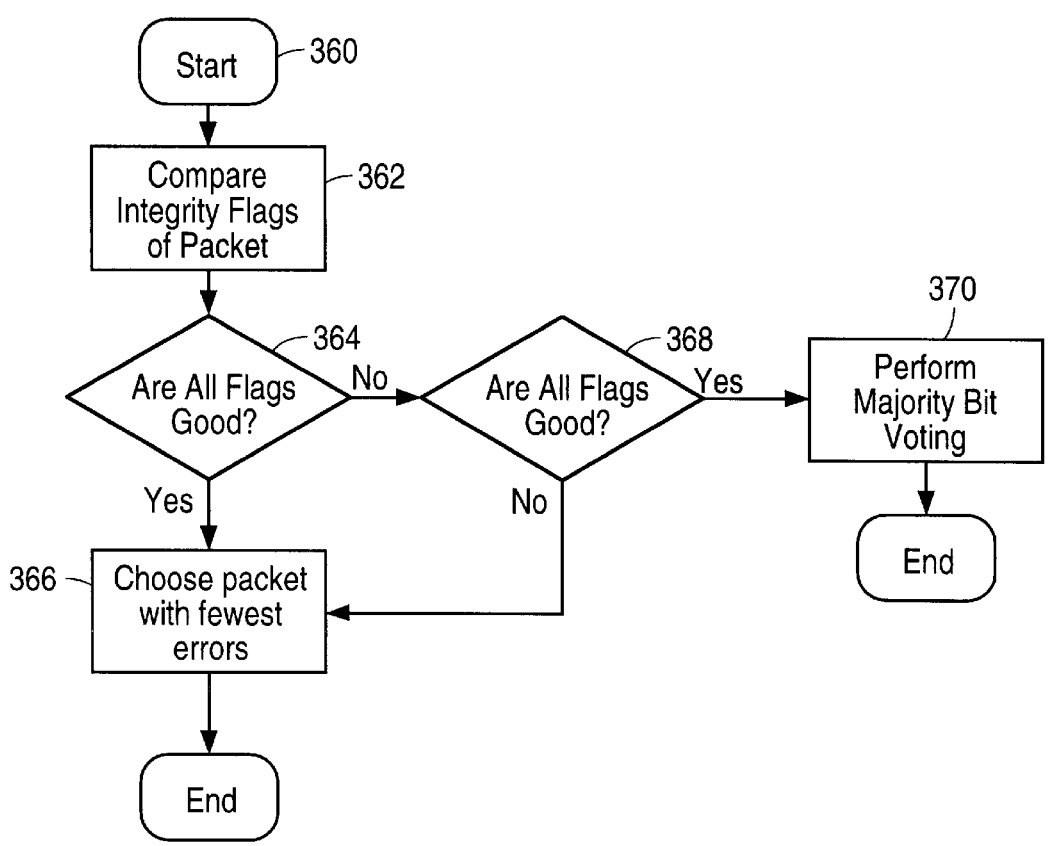
FIG. 13 is a flowchart of the error packet overlay error correction method shown in FIG. 12.

FIG. 13 is a flowchart showing the operation of the error packet overlay error correction method and when the majority bit voting error correction method is conducted. The method begins at 360. At 362, the integrity flags (flag1, flag2, . . . flagM) of a particular data packet (1,2, . . . M) for each datastream are compared to each other. For example, as shown in FIG. 12, for data packet A, the integrity flag (flag1) of datastream_1 is good, the integrity flag (flag2) of datastream_2 is bad and the integrity flag (flagM) of datastream_N is bad. At 364, it is determined whether or not all of the integrity flags are good. At 366, if all of the integrity flags for a particular data packet are good, then the data packet with the fewest errors is stored within the temp_buffer memory 352. At 368, it is determined if all of the integrity flags are bad. If all of the integrity flags are bad, then at 370, a majority bit vote by packet is done as long as at least three datastreams are present. If the integrity flags are not all bad, then the packet with the fewest errors is selected at 366.

Figure 14:
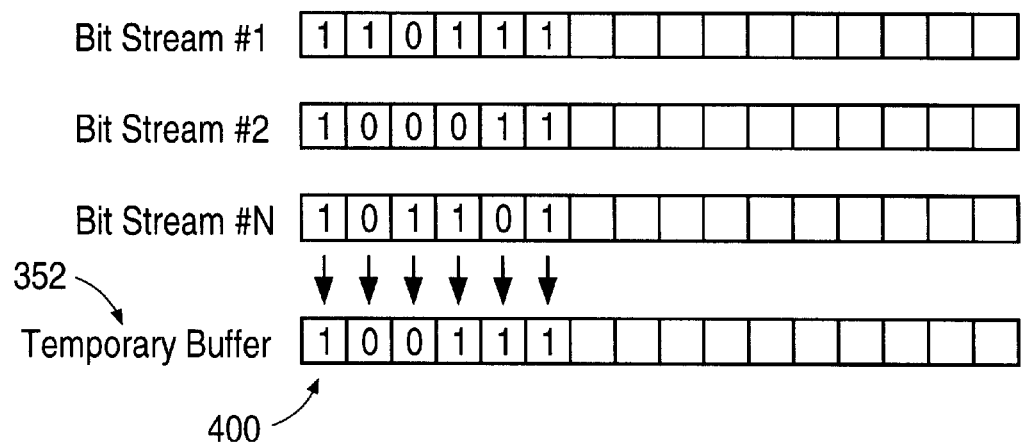
FIG. 14 is a schematic diagram of the majority bit voting packet error correction method, shown in FIG. 11.

FIG. 14 is a schematic diagram of the majority bit vote by packet method that is part of the error detection and correction method shown in FIG. 11. Each bit within the data packet is chosen to match the majority (more than fifty percent) of the bits being compared (i.e., the chosen value is the same as the value of 2 out of 3 bits that are compared). For example, as shown in FIG. 14, bit_one 400 in each datastream is 1,1, . . . 0 respectively for each datastream such that the majority (more than fifty percent) of the bits are equal to "1". Accordingly, bit_one is set to "1". Once the new packet values are determined by the majority bit method, the newly assembled data packets are checked for errors using a conventional checksum method and the BCH method and are then stored in the temp_buffer memory. In this manner, all of the data packets within the datastream are determined so that the datastream can then be processed by the incoming message system.

Thus, using this multi-level error detection and correction system in accordance with the invention, the data transmitted from the remote unit to the computer will be substantially error free. For most transmissions, the data may need only to be resent once and the error packet overlay method will detect and correct any errors in the data. This multi-level error detection and correction system increases message transmission reliability. In addition, this error correction and detection system is fast so that the user will very quickly receive an acknowledgement signal. This quick error detection and correction allows the user and remote unit to stay connected to the computer as short amount of time as possible without sacrificing message transmission integrity.

While the foregoing has been with reference to a particular embodiment of the invention, it will be appreciated by those skilled in the art that changes in this embodiment may be made without departing from the principles and spirit of the invention, the scope of which is defined by the appended claims.

We claim:

1. A device for communicating electronic messages with a computer remote from the device over a telephone handset, the device comprising:

a housing having an outer surface;

a user input device inside the housing that generates electronic messages in response to actions of the user;

a circuit inside the housing that generates error corrected signals corresponding to the electronic messages;

a speaker integrally formed in the outer surface of the housing which emits audible acoustic signals corresponding to the error corrected signals, the speaker being held adjacent to a mouthpiece of the telephone handset to cause the audible signals to be received by a microphone in the telephone mouthpiece and transduced by the microphone into electrical signals in order to transmit the error corrected messages to the remote computer; and a pager receiver inside the housing which receives data from the remote computer over a pager frequency.

2. A system for communicating data between a computer and a unit remote from the computer, comprising means in the remote unit for receiving input information from a user and for producing data signals corresponding to the input information; means for producing error corrected message signals from the data signals; means for generating acoustical tones corresponding to the error corrected message signals; a speaker that emits the acoustical tones into a mouthpiece of a telephone handset held adjacent to the speaker to cause the acoustical tones to be received by a microphone in the telephone mouthpiece and transduced by the microphone into electrical signals to send the error corrected message signals to the computer; a receiving means in the remote unit for unidirectionally receiving data from the computer over a second communications link, which is independent of the telephone handset; and means for providing an acknowledgment signal over an earpiece of the telephone handset to the user to provide instructions to the user.

3. The system of claim 2, wherein the error corrected message producing means comprises means for generating forward error correction data.

4. The system of claim 2, wherein the remote unit further comprises means for generating facsimile, electronic mail and pager messages.

5. The system of claim 2, wherein the first communications link comprises a telephone link.

6. The system of claim 2, wherein the second communications link comprises a wireless link, and the means for receiving data from the second communications link comprises a radio pager receiver.

7. The system of claim 2, wherein the acknowledgment signal is an audible signal generated by the computer and sent over the first communications link to the user of the remote unit.

8. The system of claim 7, wherein said audible signal comprises an audible voice prompt.

9. The system of claim 7, wherein said audible signal comprises means for acknowledging receipt of the acoustical tones.

10. The system of claim 7, wherein said audible signal comprises means for instructing the user to start a communications session.

11. The system of claim 2, wherein the computer further comprises means for detecting and correcting errors in the error corrected message signals.

12. The system of claim 11, wherein the means for detecting and correcting errors comprises sending data packets from the remote unit to the computer, the data packets each comprising a plurality of bits; checking the data packets for errors in the computer; communicating to the user of the remote unit from the computer to resend all data packets when errors are present in any data packet; comparing the first-sent data packets to corresponding ones of the resent data packets to determine the presence of errors; and comparing corresponding bits of each first-sent data packet and each resent data packet to select a bit value that is present in a more than half of the data packets.

13. A method for communicating data between a computer and a unit remote from the computer, comprising:

receiving input information from a user to the remote unit;

generating data signals in the remote unit corresponding to the input information;

producing error corrected message signals in the remote unit corresponding to the data signals;

generating acoustical tones in the remote unit corresponding to the error corrected message signals;

holding a speaker of the remote unit adjacent to a mouthpiece of a telephone handset;

emitting the acoustical tones from the speaker into the mouthpiece of the telephone handset to cause the acoustical tones to be received by a microphone in the telephone mouthpiece and transduced by the microphone into electrical signals to send the acoustical tones over a telephone line;

receiving, in a receiving unit of the remote unit, data from the computer over a receive-only second communications link, which is independent of the first communications link; and means for providing an acknowledgment over the telephone line to the user to provide instructions to the user.

14. The method of claim 12, wherein producing error corrected message signals comprises generating forward error corrected data by encoding the data signals.

15. The method of claim 13, wherein coupling the acoustical tones to the first communications link comprises generating the acoustical tones over a speaker on the remote unit that is held near an input device attached to the first communications link.

16. The method of claim 13, wherein receiving the acknowledgment signal comprises receiving a message indicating that the data transmission is successful.

17. The method of claim 13, wherein receiving the acknowledgment signal comprises receiving a request to resend the data.

18. The method of claim 13, further comprising detecting and correcting errors in the error corrected message signals from the remote unit.

19. The method of claim 18, wherein the detecting and correcting errors comprises sending data packets from the remote unit to the computer, the data packets each comprising a plurality of bits; checking the data packets for errors in the computer; communicating to the user of the remote unit from the computer to resend all data packets when errors are present in any data packet; comparing the first-sent data packets to the corresponding resent data packets to determine the presence of errors; and comparing corresponding bits of each first-sent data packet and each resent data packet to select a bit value that is present in a more than half of the data packets.

20. For use in a system for communicating data between a computer and a unit remote to the computer, the remote unit comprising means for receiving input information from a user and for producing data signals corresponding to the input information; means for producing error corrected message signals from the data signals; means for generating acoustical tones corresponding to the error corrected message signals; a speaker for emitting the acoustical tones towards an adjacently located mouthpiece of a telephone handset so that the acoustical tones are received by a microphone in the telephone mouthpiece and transduced by the microphone into electrical signals for transmission to the computer; means for providing an acknowledgment signal, over the first communications link to the user of the remote unit to provide instructions to the user; and a receiving means for receiving data from the computer over a send-only second communications link, which is independent of the first communications link.

21. A method for communicating data from a handheld device to a remote computer over a telephone line, comprising:

entering data into the device using a user input device;

generating error corrected signals based on the entered data;

holding a speaker of the device adjacent to a mouthpiece of a telephone handset; and emitting acoustical tones from a speaker in the device into the mouthpiece of the telephone handset to cause the acoustical tones to be received by a microphone in the telephone mouthpiece and transduced by the microphone into electrical signals in order to communicate the error corrected signals to the remote computer.

* * * * *